United States Patent [19]

Armstrong et al.

[11] Patent Number: 5,027,116
[45] Date of Patent: Jun. 25, 1991

[54] SELF-CALIBRATING ANALOG TO DIGITAL CONVERTER

[75] Inventors: Michael Armstrong, San Jose; Paul R. Gray, Orinda, both of Calif.

[73] Assignee: Micro Linear Corporation, San Jose, Calif.

[21] Appl. No.: 18,019

[22] Filed: Feb. 24, 1987

[51] Int. Cl.[5] .............................................. H03M 1/10
[52] U.S. Cl. .................... 341/120; 341/118; 341/155; 330/9
[58] Field of Search ................. 340/347 AD, 347 CC; 330/9; 341/118, 120, 141, 155, 163

[56] References Cited

U.S. PATENT DOCUMENTS

| | | | |
|---|---|---|---|
| 3,842,413 | 10/1974 | LaGarde | 340/347 AD |
| 4,364,027 | 12/1982 | Murooka | 340/347 CC |
| 4,417,160 | 11/1983 | Schade, Jr. | 307/353 |
| 4,429,282 | 1/1984 | Saari | 330/9 |
| 4,517,549 | 5/1985 | Tsukakoshi | 340/347 AD |
| 4,529,965 | 7/1985 | Lee | 340/347 AD |
| 4,543,534 | 9/1985 | Temes et al. | 330/9 |
| 4,555,668 | 11/1985 | Gregorian et al. | 330/9 |

OTHER PUBLICATIONS

David P. Laude and James D. Beasom, "5 V Temperature Regulated Voltage Reference", pp. 1071–1075, IEEE Journal of Solid State Cir., vol. SC-15, No. 6, Dec. 1980.

Primary Examiner—A. D. Pellinen
Assistant Examiner—Marc S. Hoff
Attorney, Agent, or Firm—Limbach, Limbach & Sutton

[57] ABSTRACT

A self calibrating algorithmic analog-to-digital converter is disclosed for which the gain of the conversion loop is precisely adjusted and controlled by an array of switched capacitors such control being stored in a latch. The offset of the gain stage is reduced by reducing the amount of charge injected from the gate of the input zeroing MOS switch.

13 Claims, 7 Drawing Sheets

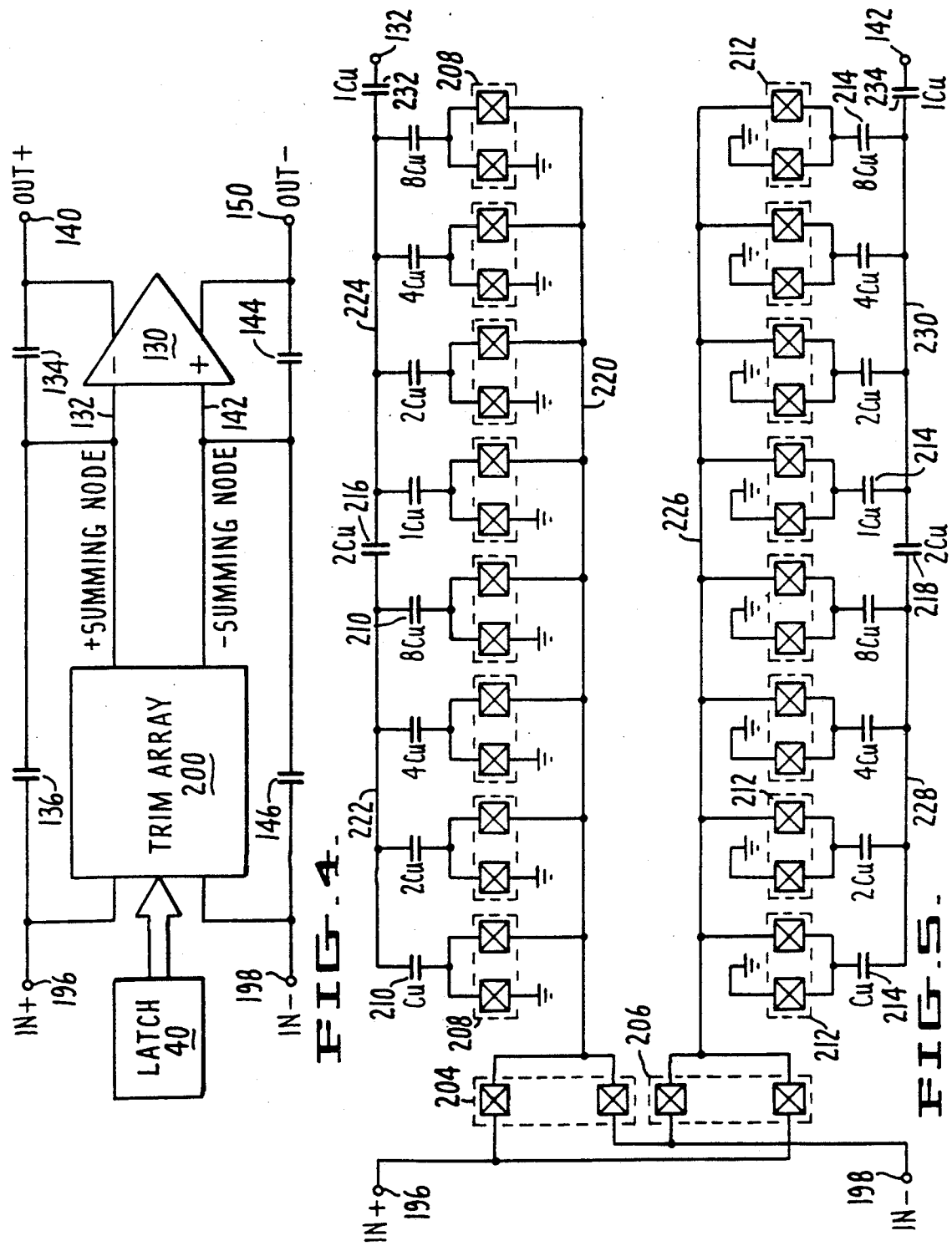

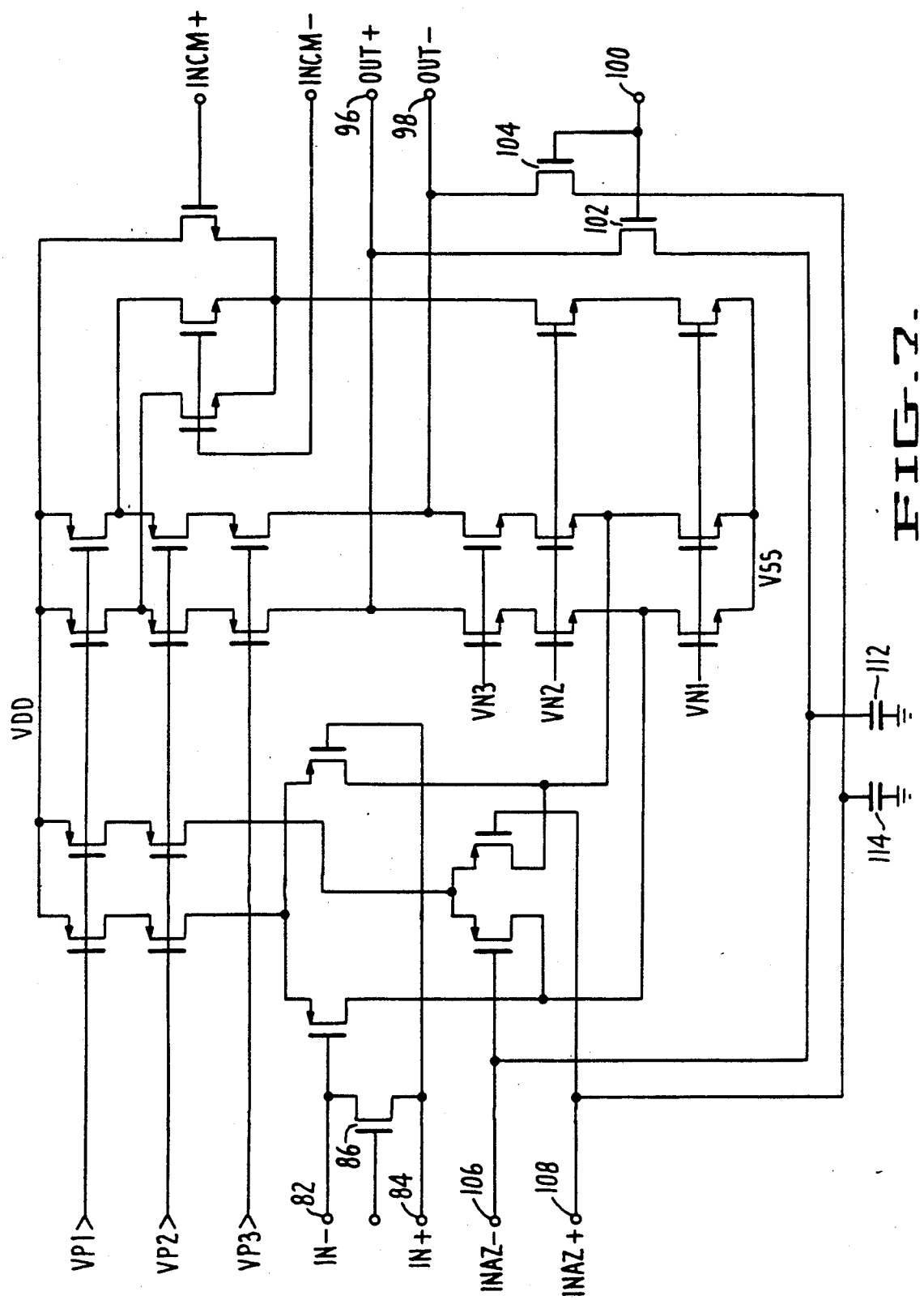

SELF-CALIBRATING ANALOG TO DIGITAL CONVERTER

FIELD OF THE INVENTION

This invention relates to the field of analog-to-digital converters. More particularly a self-calibrating technique for such a converter is disclosed. In addition, a means for reducing the effects of input charge injection is disclosed.

BACKGROUND OF THE INVENTION

There are many applications which use analog-to-digital conversion. Typically, analog signals resulting from an analog process are converted to digital information in order for the artifact of that analog event to be operated upon by a digital computer. There are many such applications which not only require that the results be consistent from one event to the next but also require that the results be accurate to within some predefined limits. One typical system which provides enhanced accuracy for such applications is an algorithmic analog-to-digital converter.

An algorithmic analog-to-digital converter conventionally includes an input sample and hold circuit, an amplifier circuit with a predetermined gain, a comparator to determine the value of the bit currently under consideration, a summing node and a recycling sample and hold circuit for recycling the resulting voltage from the current bit decision in preparation for the next bit decision cycle.

The sample and hold circuits can be any standard sample and hold circuit. The signal sample is coupled to the input of the amplifier circuit for amplification at a predetermined gain. The result from that amplification is then compared to a reference voltage from which one of two actions result.

First, if the result of the amplification is greater than the reference voltage then the most significant bit of the final digital result is set equal to a logical "one". The reference voltage is then subtracted from the result of the amplification. This second result is stored on the recycling sample and hold circuit which can include a gain-of-one op amp. This second result is compared to the reference voltage to determine the next most significant bit in the final digital result.

Second, if the result of the amplification is less than or equal to the reference voltage then the most significant bit is set equal to a logical "zero". The result is passed through the summing node unchanged and coupled to the input of the op amp circuit for the next cycle of the algorithm. The algorithm cycle is continued until all the bits are filled in the final digital result as necessary for the required accuracy.

With the advent of integrated circuit technology and the parallel goals to reduce system size and power consumption, traditional methods for calibrating A/D converters, such as the use of rheostats, are no longer adequate.

Examples of present calibration methods include:
1. Coupling external calibration resistors or capacitors to the integrated circuit;
2. Laser trimming of integrated resistors on the integrated A/D converter circuit;
3. Integrated calibration through fuse link or PROM circuitry on the integrated A/D circuit; and
4. Storing a calibration value in a capacitor which must be refreshed with each A/D conversion cycle such as described in U.S. Pat. Nos. 4,529,965, 4,429,282, 4,543,534, 4,517,549 and 4,555,668.

These methods are inadequate for a variety of reasons. The first method is expensive in that it requires extra components and additional board space. The second and third methods do not allow for any recalibration of the system subsequent to operating shifts due to aging of the circuitry. The fourth method dramatically slows down A/D operation by requiring a calibration cycle during each conversion.

Another technique for improving conversion accuracy involves nulling the offset voltage of the amplifier. During a nulling cycle in prior art op amp circuits the inputs are "zeroed out" by connecting both the inverting and non-inverting inputs to ground through MOS switches. The voltage on the outputs of an op amp with zeroed out inputs, will, have a theoretical value of zero, however, due to D.C. errors and to charge injected to the inputs of the op amp circuit from the gates of each input grounding MOS switch the outputs are often offset from zero. This offset adversely affects the accuracy of the analog-to-digital conversion in proportion to the size of the offset. More details of such a nulling method can be found in the following U.S. Pat. No. 4,417,160.

An improved A/D circuit is needed which is calibratable without external circuitry, without altering the physical structure of the device and which does not lengthen the A/D conversion cycle time.

An improved A/D circuit is needed for which the nulling circuit charge injection and the resulting offset is reduced.

SUMMARY OF THE INVENTION

In the preferred embodiment of the present invention, an algorithmic analog-to-digital converter is provided for which an input sample voltage is analyzed with respect to an internal reference voltage including an algorithmic comparison sequencer having a calibratable loop gain. The loop gain of the algorithmic comparison sequencer is set equal to two. During the calibration cycle the sample voltage is set equal to the reference voltage and, based on the output of the A/D conversion the loop gain is adjusted in order to achieve an expected output. The conversion takes place bit by bit, one bit per cycle of the algorithmic comparison sequencer by sequentially comparing the sample to the reference voltage to produce a digital result. The calibration takes place bit by bit, one bit per conversion.

As a result of the loop gain being set equal to two and the sample voltage being set equal to the reference voltage a full scale digital output is expected during the calibration cycle. Having the expected result of full scale output during the calibration cycle requires each magnitude bit of the output to be a logical "one".

The loop gain is directly proportional to the gain established by the ratio of input capacitance to feedback capacitance in an amplifier gain stage contained in the loop. The input capacitors to the gain stage op amp can be trimmed by an array of switched capacitors.

As a step of the calibration sequence the input capacitance is modified by selecting appropriate ones of the capacitors in the array of switched capacitors to appropriately adjust the loop gain. The information for adjusting the calibration capacitors is stored in a latch. The calibration information remains unchanged until the user requests another calibration cycle. Thus, the calibration means do not impede normal operation of the convertor.

In order to further enhance the accuracy of the A/D convertor of the present invention the injected charge to the inputs of the amplifier stage is reduced during a nulling sequence by way of an input circuit which connects, the inverting input to the non-inverting input through one MOS transistor. It has unexpectedly been found that by doing so the charge injected into the amplifier during the nulling cycle and affecting the null value is greatly reduced.

BRIEF DESCRIPTION OF THE DRAWINGS

FIG. 4 shows a block diagram of the gain-of-two calibration circuit.

FIG. 5 shows the detail of the gain trim capacitor array.

FIG. 7 shows the detail of an op amp and nulling circuit of the preferred embodiment.

DETAILED DESCRIPTION OF THE INVENTION

Figure 1:
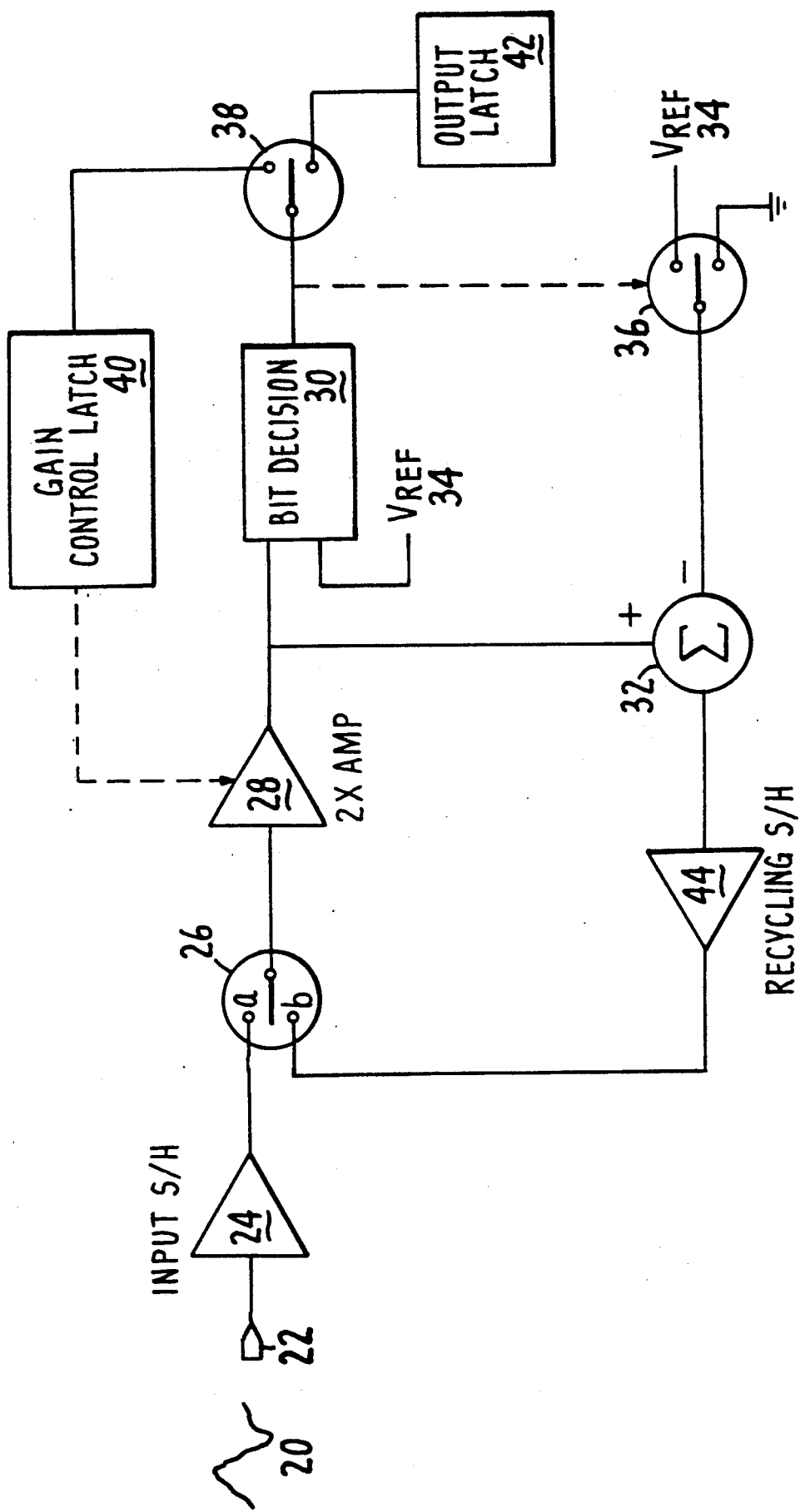
FIG. 1 shows a block diagram of the algorithmic converter of the present invention.

Referring to FIG. 1, analog input signal 20 is applied to input 22 and coupled to sample and hold circuit 24, which in turn, is coupled to pole 26A of switch 26. The wiper of switch 26 is coupled to amplifier 28. The output of amplifier 28 is coupled to bit decision stage 30 and summing node 32. Decision stage 30 also receives $V_{ref}$ as an input for a comparison reference. The output of the decision stage 30 is coupled to actuate switches 36 and either, to capacitor array trim control latch 40, or to the conversion output latch 42 by switch 38. Switch couples either $V_{ref}$ or ground to summing node 32 depending upon the output of the decision stage 30. The output of summing node 32 is coupled to the input of gain-of-one recycling sample and hold amplifier 44. The output of amplifier 44 is coupled to pole 26B of switch 26. The loop gain of this circuit is the gain of amplifier 28 minus any parasitic losses associated with the circuit loop consisting essentially of summing node 32, recycling sample and hold circuit 44, and switch 26.

Figure 2:
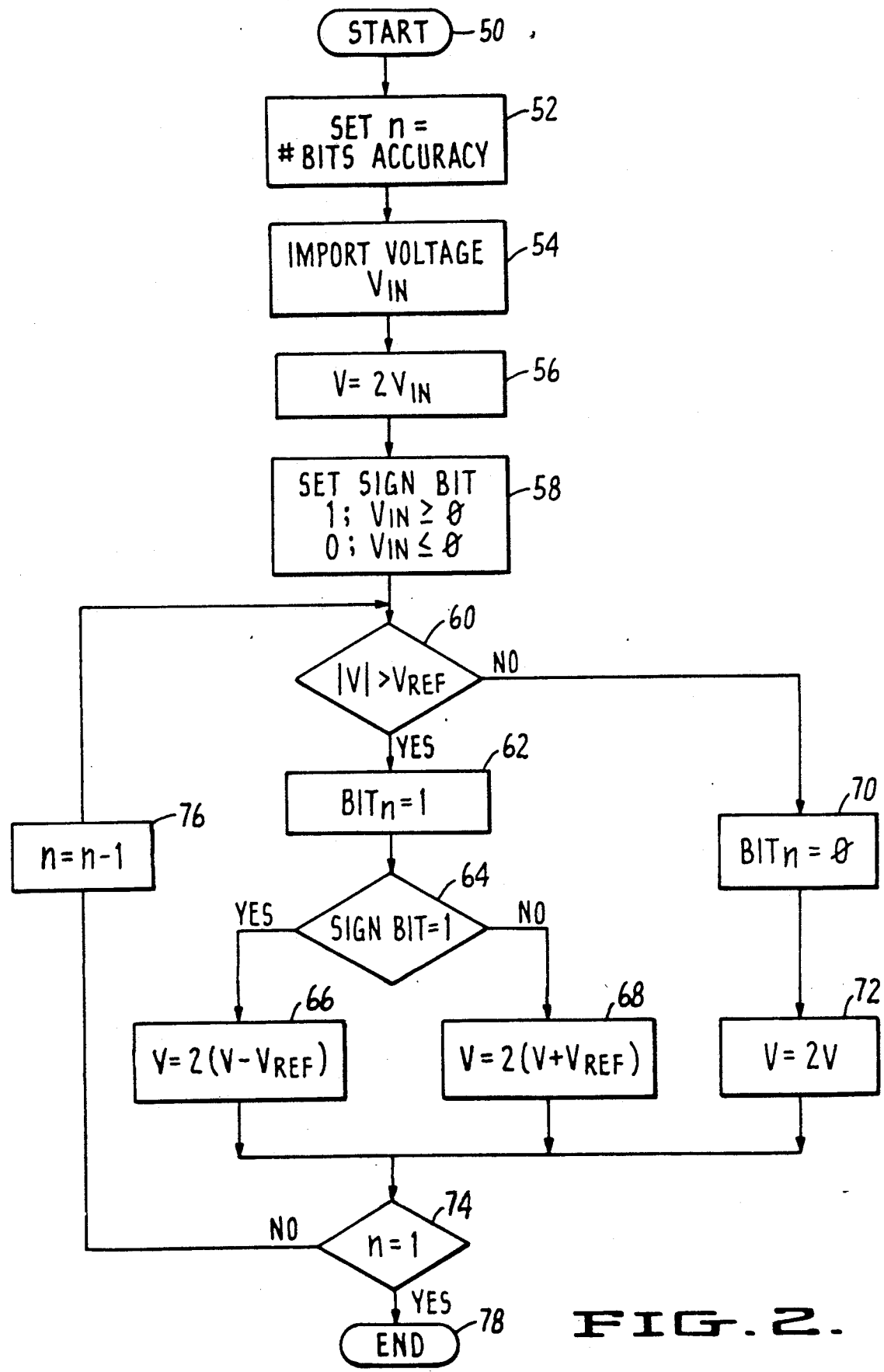
FIG. 2 shows a flow chart of the algorithm utilized in the present invention.

The analog-to-digital convertor of FIG. 1 employs a conversion algorithm as shown in simplified flow chart form in FIG. 2. The conversion process is entered in the START block 50. The number of bits of accuracy in the digital output is designated by the user in block 52. The conversion operates to resolve the digital result, bit by bit, one bit at a time from the most significant bit to the least significant bit. The analog voltage "$V_{in}$" is imported in block 54 from the input circuitry to sample and hold circuit 24 of FIG. 1. The voltage is multiplied by two as shown in block 56 to provide "V" which is equal to "$2V_{in}$". The sign bit is set to "one" if "$V_{in}$" is positive and to "zero" if negative.

In decision block 60 the magnitude of "V" is compared to the magnitude of $V_{ref}$. $V_{ref}$ is always a positive voltage. If the absolute value of "V" is greater than the absolute value of $V_{ref}$ bit$_n$ is set equal to one, as shown in block 62 where "n" corresponds to the bit in the final digital result currently being determined. Bit$_n$ is set by placing the appropriate logic level into the appropriate slot of conversion output latch 42 via switch 38.

If the sign bit is equal to "one" in block 64, then $V_{ref}$ is subtracted from V and the sum is multiplied by 2 in block 66. If the sign bit is equal to "zero" in block 64, then $V_{ref}$ is added to V and the sum is multiplied by 2 in block 68.

If the absolute value of "V" is less than the absolute value of $V_{ref}$, in the comparison on decision block 60 bit$_n$ is set equal to "zero" in block 70. Next, "V" is set equal to "2V" in block 72.

In decision block 74, a check is made to determine whether n=1 to determine whether the conversion is complete. If n≧1 the comparison cycle repeats to determine the value of the next less significant bit. In block 76 n is set equal to n−1. This is followed by comparison of "V" to $V_{ref}$ in block 60 to determine the value of the next bit. If n=1 in decision block 74 the algorithm is ended in END block 78.

Figure 3A:
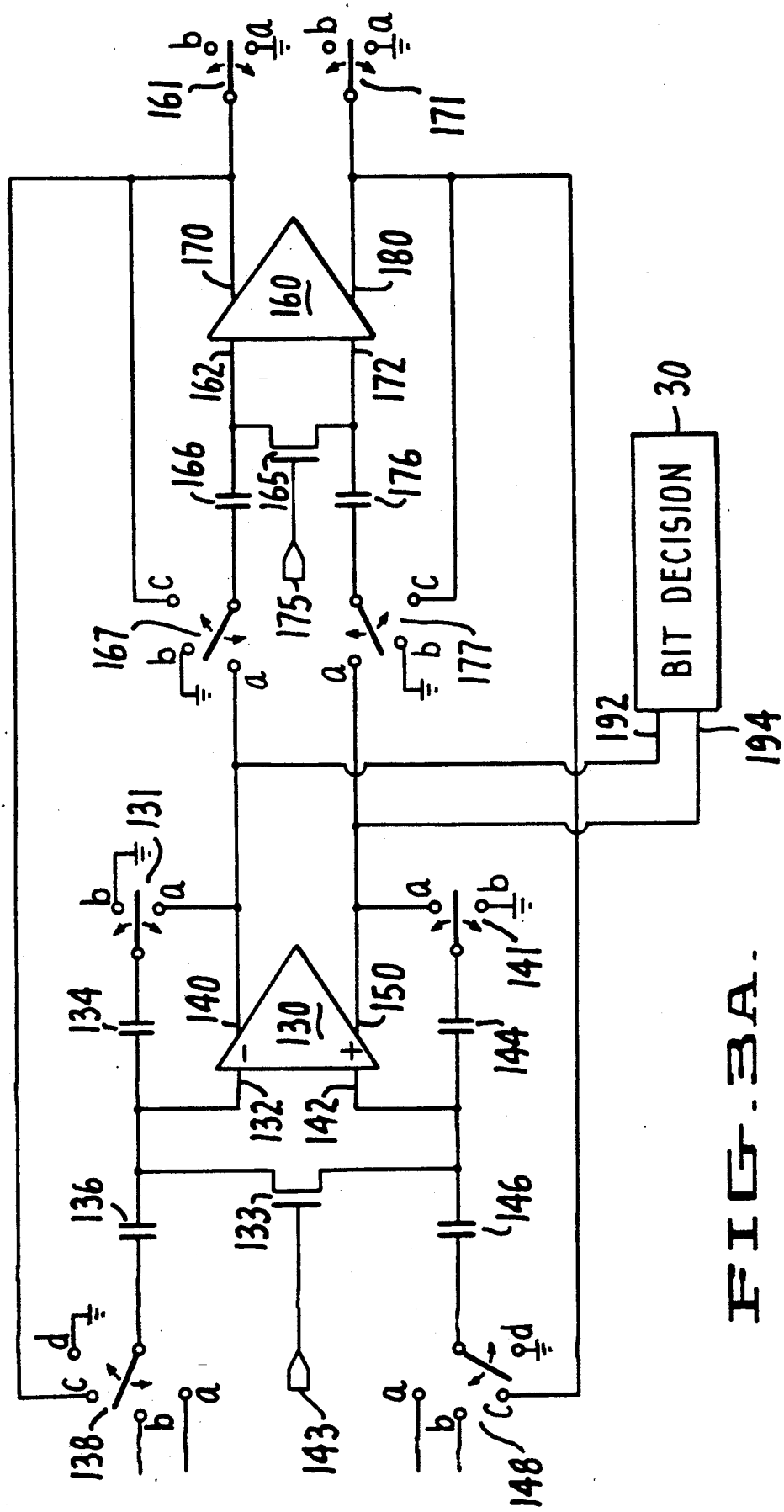
FIG. 3a shows the circuit of the A/D convertor of the present invention.
Figure 3B:
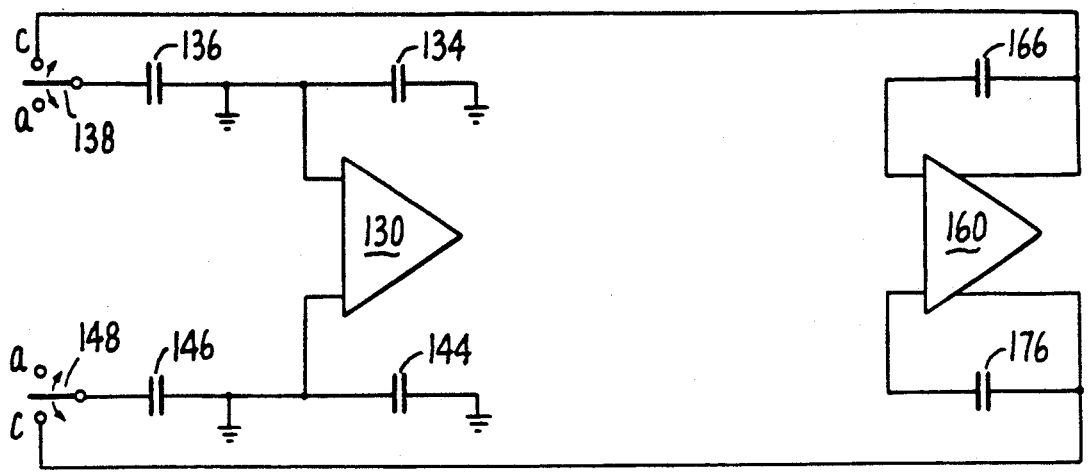
FIGS. 3b, 3c and 3d show those portions of that circuit necessary for the capture, comparison and gain-of-two cycles of the algorithmic convertor of the present invention.
Figure 3C:
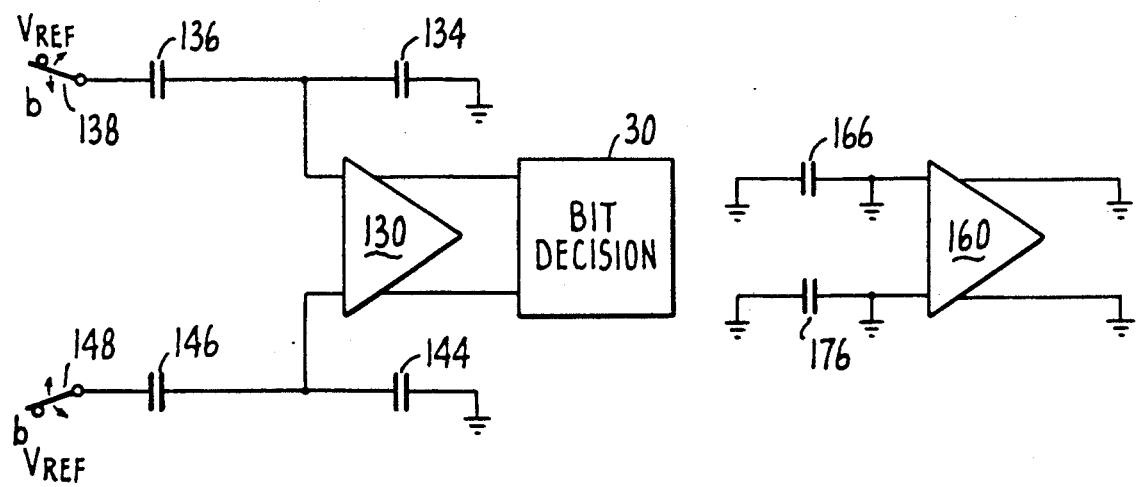
Figure 3D:
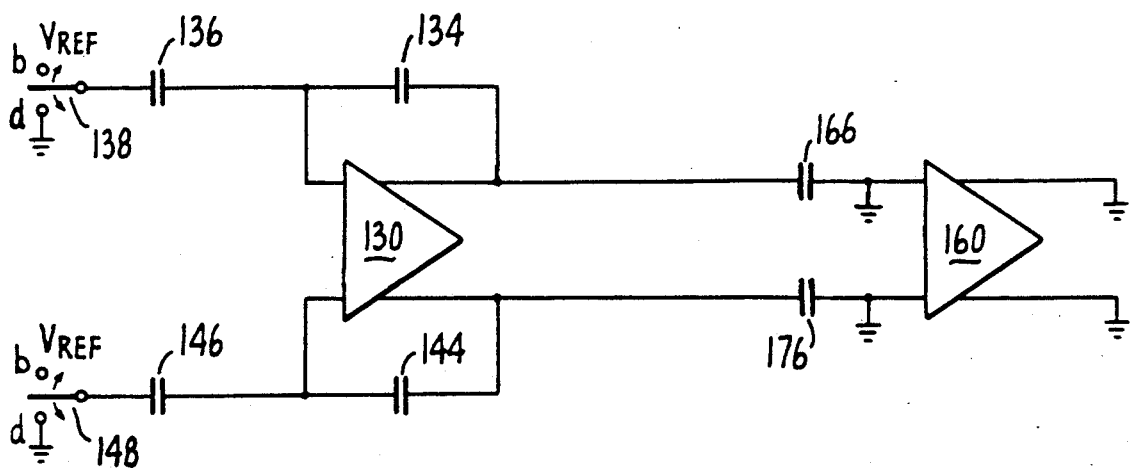

FIG. 3a shows the circuit which performs the functions of the block diagram of FIG. 1 and the algorithm in FIG. 2. FIGS. 3b, 3c and 3d show a circuit implementation for each of the active states involved in carrying out the algorithm. In each of the FIGS. 3b, 3c and 3d, only those portions of the circuit which are presently active and appropriately coupled are shown. Those portions of the circuit which are not presently active and add nothing to the operation of the circuit for that step in the algorithmic cycle are removed from the circuit in order to avoid detracting from understanding.

In FIG. 3ma input switch 138 is coupled to receive a new sample of an analog signal to be converted on pole "a", to the reference voltage on pole "b", to the output of the previous cycle, i.e. the output 170 of op amp 160, on pole "c" or to ground on pole "d". The wiper of switch 138 is coupled to a first terminal of capacitor 136. The other terminal of capacitor 136 is coupled to inverting input 132 of op amp 130, a first terminal of transistor 133 and capacitor 134. The transistor 133 connects the inputs 132 and 142 together through a low impedance input when a sufficiently high voltage is applied to input 143. As will be described below this achieves similar circuit results to connecting each of the inputs 132 and 142 to ground. The other terminal of capacitor 134 is coupled to the wiper of switch 131. Switch 131 is coupled to output 140 of op amp 130 on pole "a" or to ground on pole "b". The outputs 140 and 150 of op amp 130 are coupled to the inputs of bit decision block 30.

The wiper of switch 167 is coupled to a terminal of capacitor 166. Switch 167 couples capacitor 166 to the output 140 of op amp 130 on pole "a" to ground on pole "b" or to the output 170 of op amp 160 on pole "c". The other terminal of capacitor 166 is coupled to a first terminal of transistor 165 and to inverting input 162 of op amp 160. The transistor 165 connects the inputs 162 and 172 together through a low impedance input when a sufficiently high voltage is applied to input 175. As will be described below this achieves similar circuit results to connecting each of the inputs 162 and 172 to ground.

Input switch 148 is coupled to receive a new sample of an analog signal to be converted on pole "a", to the reference voltage on pole "b", to the output of the previous cycle, i.e. the output 180 of op amp 160, on pole "c" or to ground on pole "d". The wiper of switch 148 is coupled to a first terminal of capacitor 146. The other terminal of capacitor 146 is coupled to non-inverting input 142 of op amp 130, a second terminal of transistor 133 and capacitor 144. The other terminal of capacitor 144 is coupled to the wiper of switch 141. Switch 141 is coupled to output 150 of op amp 130 on pole "a" or to ground on pole "b".

The wiper of switch 177 is coupled to a terminal of capacitor 176. Switch 177 couples capacitor 176 to the output 150 of op amp 130 on pole "a", to ground on pole "b" or to the output 180 of op amp 160 on pole "c". The other terminal of capacitor 176 is coupled to a first terminal of transistor 165 and to non-inverting input 172 of op amp 160. The outputs 170 and 180 of the op amp 160 are also coupled to the wiper of switches 161 and 171, respectively. Switches 161 and 171 are each coupled to ground or pole "a" or to open circuit on pole "b".

Because the circuit of the present invention is implemented as a MOS integrated circuit switches 138, 148, 131, 141, 161, 171, 167 and 177 are implemented as a plurality of low impedance MOS transfer switches. The control to the gates of these switches comes from the digital controller portion of the integrated circuit which, though not a portion of the present invention, is incorporated in a device incorporating the present invention made by Micro Linear Corporation. The current path in each switch is from source to drain. The switch is closed for a particular path by applying an appropriate voltage to the gate of the MOS switch. Those multipole switches may have common source or drain regions and are connected so that only one gate at a time is activated. The "position" of the switches is determined by the current cycle of the algorithm.

It will be clear from studying FIGS. 3a, 3b, 3c and 3d that the fundamental circuit configuration includes the two op amps 130 and 160 whose outputs are coupled to the inputs of the other. By appropriately positioning the switches to achieve the sub-circuits of FIGS. 3b, 3c and 3d the circuit can be configured to receive a new sample, to amplify a signal by two, to subtract the reference voltage from a previous result or to merely retain a particular voltage level.

The block diagram of FIG. 1 and the circuit of FIGS. 3 perform the same function. It should be remembered here the block diagram of FIG. 1 is representative only and is intended to be instructional by setting out separately each of the functional elements of the circuit. However, by feeding the signal back and forth between cross-coupled op amps 130 and 160 and appropriately positioning switches 138, 148, 131, 141, 161, 171, 167 and 177 the circuit of FIG. 3a will implement each of the functions of the block diagram of FIG. 1.

It will be understood from the discussion below that several groups of circuit blocks of FIG. 1 are combined into fewer circuit elements. FIG. 1 shows only a single line signal path whereas FIG. 3a shows a double line data path; one each for the non-inverting and inverting inputs and outputs of op amps 130 and 160.

By simply adding "10" to any identifying number for the negative signal path the complementary identifying number for the negative signal path is obtained. In other words switch 138 in the positive signal path is the complementary circuit element switch 148, i.e., (138+10=148). This is not true for those few circuit elements which do not have complementary elements which are: op amps 130 and 160, transistors 133 and 165 and inputs 143 and 175.

Switches 138 and 148 of FIG. 3a are each a combination of switches 26 and 36 of FIG. 1. The function of summing block 32 in FIG. 1 is performed by capacitors 136 and 146 with a sufficiently high voltage on the input 143 to transistor 133 to effectively connect the inputs 132 and 142 together through a low impedance path.

Because the op amp 130 is a differential amplifier the important aspect of the input voltage is not the actual magnitude of the voltages on the input but rather the difference between voltages applied to each of the inputs. Thus, connecting the two inputs of an op amp circuit together through a low impedance path achieves a similar circuit result to connecting each of those inputs to ground. For example, to capture a signal on a capacitor to a prior art op amp one would ground the inputs. In the present invention one would short the inputs together. To simplify this disclosure, where ever both inputs 132 and 142 of op amp 130 or 162 and 172 of op amp 160 are each shown to be connected to ground it may be assumed that those input pairs are coupled together through a low impedance path by transistors 133 or 165, respectively.

The gain-of-two amplifier 28 of FIG. 1 is formed by op amp 130, switches 131 and 141 connected to pole "a" and a sufficiently low voltage on the input 143 to cause a sufficiently high impedance across transistor 133 to effectively isolate inputs 132 and 142. Recycling sample and hold circuit 44 of FIG. 1 is formed by op amp 160 with switches 161 and 171 connected to pole "b" and a sufficiently low voltage on the input 175 to transistor 165 to form such a high impedance path as to effectively isolate inputs 162 and 172. Bit decision block 30 in FIG. 1 is formed by decision block 30 and op amp 130 configured to run open loop with switches 131 and 141 connected to pole "b" and transistor 133 turned off by a low voltage on the input 143.

FIG. 3b shows the appropriate interconnections to capture the previous remainder for subsequent processing of the next cycle. In the event that this is the first cycle of the algorithm rather than a subsequent cycle as shown here, switch 138 may be toggled to receive the initial sample of the analog signal from sample and hold circuit 24 as shown in FIG. 1. Amplifier 130 has inverting input 132 coupled to ground. The inverting input 132 is connected to capacitor 134. The other terminal of capacitor 134 is also coupled to ground. Also connected to the inverting input 132 is input capacitor 136. Input capacitor 136 is coupled to receive a signal through switch 138. The capacitance of input capacitor 136 is twice that of feedback capacitor 134. The analog signal is stored on capacitor 136. Because input capacitor 136 is also coupled to ground, input signal received through switch 138 is stored on capacitor 136 capturing the previous remainder or new sample.

The analogous conditions are also setup on the non-inverting input of amplifier 130. Capacitor 144 is connected to ground and non-inverting input 142. Non-inverting input 142 is also connected to ground and to input capacitor 146. Input capacitor 146 is coupled to receive an input signal from switch 148. The capacitance of input capacitor 146 is twice that of feedback capacitor 144. The analog signal is stored on capacitor 146. The amplifier 160 only retains any voltage it previously had captured on its outputs 170 and 180. Switches 167 and 177 of FIG. 3a are each set to pole "c" so that capacitors 166 and 176 are coupled between inputs 162 and 172 and the outputs 170 and 180, respectively.

FIG. 3c shows the appropriate interconnection for making a bit decision. Switches 138 and 148 have been toggled so as to be coupled to receive $V_{ref}$. Capacitors 136 and 146 are coupled between the wipers of switches 138 and 148 and inputs 132 and 142 of amplifier 130, respectively. In this setup, the voltage levels previously stored on capacitors 136 and 146 are compared to $V_{ref}$. Amplifier 130 will respond with a positive going signal if the magnitude of the voltage stored on capacitors 136 and 146 is greater than the magnitude of the reference voltage and a negative going signal if the magnitude of the voltage stored on capacitors 136 and 146 is less than the magnitude of the reference voltage. Because feedback capacitors 134 and 144 are not coupled to feedback outputs 140 and 150 to inputs 132 and 142, the gain of the amplifier is allowed to achieve its designed maximum which is very large and may be on the order of one million, i.e., the amplifier is running open loop.

Decision block 30 will respond to the polarity of the signal received on inputs 132 and 142 from outputs 140 and 150 with a bit decision. If the signal received on inputs 132 and 142 is positive, i.e., if the stored voltage on capacitors 136 and 14 is greater than the reference voltage, then the bit will be one. If the magnitude of voltage stored on capacitors 136 and 146 is less than the reference voltage, then the bit decision will be zero. Amplifier 160 is inactive during this cycle. Outputs 170 and 180 of amplifier 160 are connected to ground and each terminal of capacitors 166 and 176 are connected to ground and each terminal of capacitors 166 and 176 are connected to ground as are inputs 162 and 172 to amplifier 170.

FIG. 3d shows the gain-of-two state of amplifier 130. The terminals of capacitor 134 are coupled to output 140 and input 132 of amplifier 130. Similarly, the terminals of capacitor 144 are coupled to output 150 and input 142 of amplifier 130. Capacitance of input capacitors 136 and 146 is approximately equal to twice the capacitance of feedback capacitors 134 and 144 thus establishing the gain of amplifier 130 at approximately two.

The loop gain of the circuits in FIGS. 3a through 3d gain consisting essentially of sample and hold amplifier 160, input capacitors 136, and feedback capacitors 134 and 144, and capacitors 166 and 176. Input capacitor 136 has twice the capacitance of feedback capacitor 134, thereby establishing a gain-of-two with proper feedback connections. The loop gain of the circuit of FIG. 3 is the gain of amplifier 130 minus any parasitic losses associated with the loop consisting essentially of sample and hold amplifier 160, input capacitors 136, 146, 166 and 176, feedback capacitors 134, and 144.

Capacitors 136 and 146 are either connected to the reference voltage or are connected to ground depending upon the bit decision determined at the end of the previous cycle shown in FIG. 3c. If the bit decision resulted in a logical one, switches 138 and 148 remain connected to $V_{ref}$. If the bit decision was a logical zero, switches 138 and 148 connect input capacitors 136 and 146 to ground. The result is that amplifier 130 amplifies by two either the difference between the previous remainder and $V_{ref}$, if the previous remainder was larger than $V_{ref}$, or the previous remainder where the previous remainder is smaller than $V_{ref}$. The voltages resulting from the gain-of-two amplification are stored on input capacitors 166 and 176 of amplifier 160 in preparation for the next cycle.

In order for the analog to digital conversion to be accurate, it is critical for the loop gain of the amplification/comparison circuit to be equal to two. This gain is established, in part, by the ratio of capacitors 136 or 146 to capacitors 134 or 144. Even if the gain of op amp 130 is precisely two the loop gain may be somewhat different due to other losses in the loop.

In FIG. 4, the device will use the circuits and flow outlined above whether the device is performing an A/D conversion or a calibration sequence. If the device is performing a conversion the result will be transferred through internal circuitry to the user. If the device is performing a calibration sequence the result will be stored into a gain control latch 40 for adjusting the trim array 200.

During a calibration sequence the input is set equal to $V_{ref}$. Two is the minimum loop gain to achieve a full scale output. By requiring a full scale output all of the accuracy of the convertor circuitry is utilized in calibrating the trim array 200. Other gains and calibration samples could be used for certain applications. It is to be understood that in such circumstances a different result would be obtained.

FIG. 4 shows a technique for adjusting the gain of an op amp by adjusting the input capacitance. Input 196 to the gain-of-two state is coupled to input capacitor 136. Input capacitor 136 is also coupled to input 132 of amplifier 130. Feedback capacitor 134 is coupled to input 132 and output 140 of amplifier 130. Similarly, input 198 is coupled to input capacitor 146. Input capacitor 146 is also coupled to input 142 of amplifier 130. Feedback capacitor 144 is coupled to input 142 and output 150 of amplifier 130. To precisely adjust the value of input capacitors 136 and 146 trim array 200 is connected in parallel across capacitors 136 and 146. Trim array 200 is controlled by latch 40 which has been previously set in a calibration cycle. The calibration and conversion cycles each follow the simplified flow chart of FIG. 2. The result of a conversion cycle is output from the convertor whereas the result of the calibration cycle is stored in latch 40 and is used to adjust the trim array to precisely control the loop gain.

FIG. 5 shows the detail of trim array 200. Contained within the array are a plurality of switch pairs 204, 206, 208 and 212. For each switch pair one switch will be closed and the other open.

Positive input 196 is coupled to one switch each in switch pairs 204 and 206. Negative input 198 is coupled to the opposite switch in pairs 204 and 206. If input 196 is coupled through switch pair 204 to bus 220, input 198 will be coupled through switch pair 206 to bus 226. Conversely, if input 196 is coupled through switch pair 206 to bus 226, input 198 will be coupled through switch pair 204 to bus 220.

Contained in the array are eight switched capacitors 210. Four of capacitors 210 are coupled to bus 222 and four are coupled to bus 224. Bus 222 and 224 are coupled together through capacitor 216. Bus 224 is coupled to capacitor 232. Capacitor 232 is also coupled to negative input 132 of amplifier 130. Each of capacitors 210 is also coupled to a switch pair 208. Each switch 208 will either couple capacitor 210 to ground or to bus 220 as appropriate. Also contained in the array are eight switched capacitors 214. Four of capacitors 214 are coupled to bus 228 and four are coupled to bus 230. Bus 228 and 230 are coupled together through capacitor 218. Bus 230 is coupled to capacitor 234. Capacitor 234 is also coupled to positive input 142 of amplifier 130. Each of capacitors 214 is also coupled to a switch pair 212. Each switch 212 will either couple capacitor 214 to ground or to bus 226 as appropriate. Switch pairs 204, 206, 208 and 212 are controlled by latch 40 shown in FIG. 4. By appropriate selection of the contents of latch 40, proper capacitance is selected between each input 196 and 198 and output 132 and 142. These capacitances are parallel to the input capacitances 136 and 146 shown in FIG. 4, and thus can be used to precisely control the input capacitance and therefore the gain of amplifier 130.

Figure 6A:
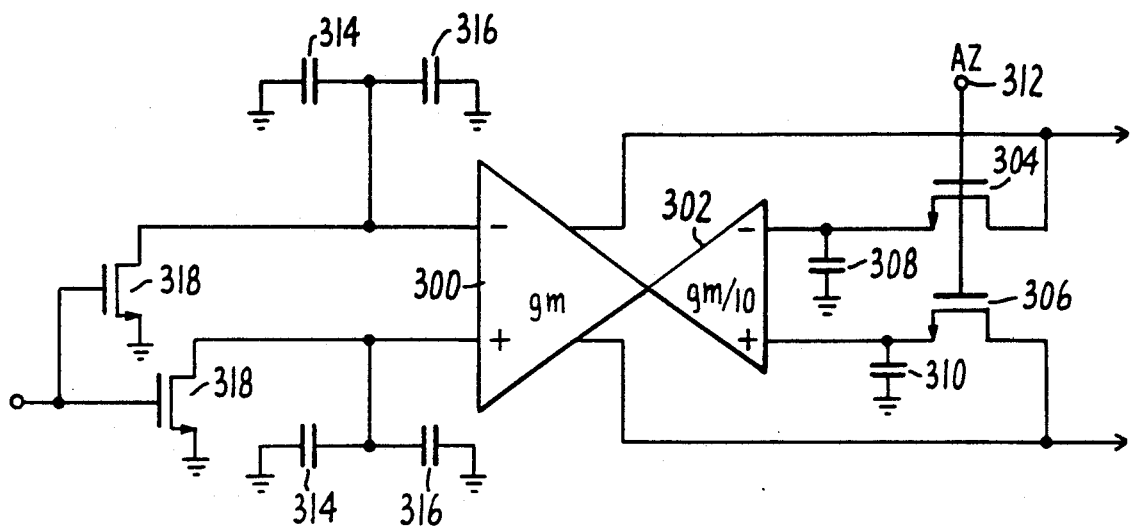
FIG. 6a shows a prior art offset nulling input circuit.

FIG. 6a shows the nulling circuit for a prior art op amp in an analog to digital converter. During an offset nulling cycle, an attempt is made to create a zero voltage input to amplifier 300. Internal amplifier 302 has a gain which is a fraction of the gain of amplifier 300. Internal amplifier 302 has a reduced gain with respect to amplifier 300 because the input transfer transistors 304 and 306 will inject charge into internal amplifier 302. The effect of the charge injected is thereby reduced. Amplifier 302 is internal to and feeds back within amplifier 300. The outputs from amplifier 300 are coupled through auto zero transistors 304 and 305 and the offset on the outputs of amplifier 300 are stored on capacitors 308 and 310 respectively. Auto zero input 312 then forces transistors 304 and 306 to decouple capacitors 308 and 310 from the outputs of amplifier 300. The charge stored on capacitors 308 and 310 which represents the offset of amplifier 300 is amplified by amplifier 302 and then used to reduce that offset.

The inputs to amplifier 300 are "zeroed out" by connecting input capacitor 314 and feedback capacitor 316 to ground and by connecting the input to ground through shunting transistors 318. The charge placed on the gates of each transistor 318 is injected into the inputs of amplifier 300 and affects the offset voltage and thereby the charge stored on capacitors 308 and 310. When transistors 318 are shut off and input and feedback capacitors are connected to receive an input signal, the output of amplifier 300 will be at a false level because of the false output nulling from the injected charge from the gates of transistors 318.

Figure 6B:
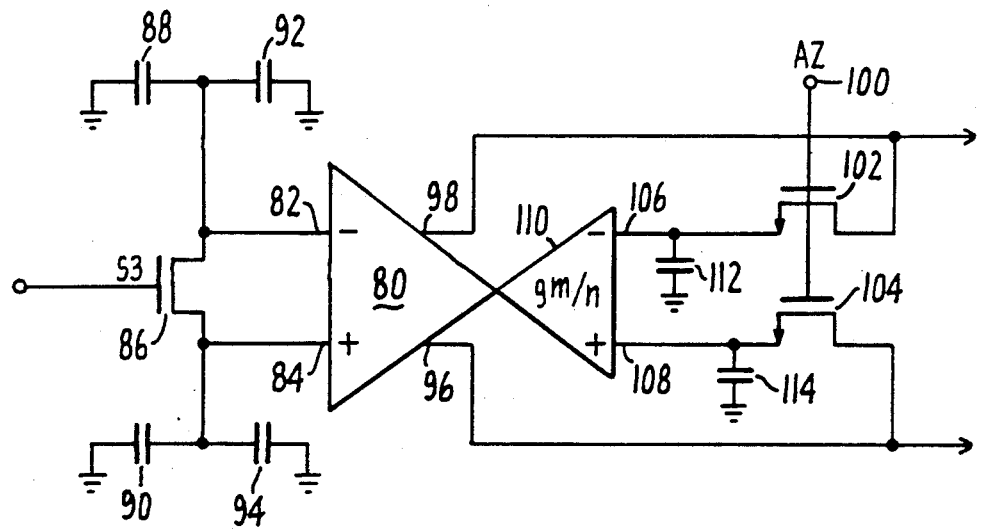
FIG. 6b shows a block diagram for the offset nulling stage of the present invention.

In contrast, the present invention minimizes this charge injection. In FIG. 6b, amplifier 80 is shown, which may be either the gain-of-two amplifier 28 or the gain-of-one amplifier 44 in FIG. 6a, is initialized to set the input voltage equal to zero. In the ideal case the output voltage would be zero for zero input. Input capacitor 88 and feedback capacitor 92 for the inverting input 82 to amplifier 80 are both grounded. Similarly, input capacitor 90 and feedback capacitor 94 to the non-inverting input 84 are also grounded. Inputs 82 and 84 are coupled to one another through a low impedance path by activating transistor 86. To inputs 82 and 84, the resistance in the source drain path of transistor 86 appears to be two resistors grounded with a center tap. The charge injected into each of the inputs 82 and 84 of amplifier 80 is equal to one-half of the charge stored on the gate of transistor 86. A transistor of one-half the width for a given gate length of a transistor used in the prior art circuit of FIG. 6a would achieve similar performance. With a smaller transistor the injected charge is correspondingly smaller. For an ideal amplifier 80, outputs 96 and 98 would each equal zero volts in response to the above-defined setup. However, due to manufacturing variables, outputs 96 and 98 will often be offset from zero. In order to counteract the offset, auto zero input 100 is activated which activates transistors 102 and 104. This creates a low resistance path between output 96 of amplifier 80 and input 106 to amplifier 110 and similarly, between output 98 and input 108. The offset voltage from outputs 96 and 98 is thus stored on capacitors 112 and 114. Auto zero input 100 is then turned off, isolating input 106 from output 96 and input 108 from output 98 so that amplifier 110 only receives the stored offset voltage from capacitors 112 and 114. The gain of amplifier 110 is some fraction of the gain of amplifier 80. In this manner, the offset voltage in amplifier 80 is reduced.

FIG. 7 shows in detail the circuit schematic of an op amp, feedback amplifier and autozero nulling circuit for the block diagram circuit of FIG. 6b. Similar numbers are used for similar circuit elements to facilitate understanding. The details of the circuit shown in FIG. 7 are not discussed, rather, FIG. 7 is included to offer additional insight to one with less than ordinary skill in the art.

The invention is disclosed in sufficient detail to enable one skilled in the art to understand the circuit and its operation and to be able to reproduce the results of the inventor without the necessity of performing undue experimentation. Nevertheless, the circuit details for common electronic circuits are left out to avoid obscuring the invention in unnecessary detail. Thus, for example, the exact schematic for a differential op amp of which many thousand are commercially available is not shown. It will be clear to one skilled in the art that the values contained herein are representative only and may be altered as deemed necessary to fulfill a particular circuit application and still perform the operation of the present invention.

What is claimed is:

1. An algorithmic analog to digital converter including an amplifier having an input capacitance and a feedback capacitance where a loop gain that is proportional to a ratio of said input capacitance to said output capacitance of an algorithmic comparison sequencer is calibrated by an apparatus comprising:
   means for causing a calibration sequence for which a sample voltage is set equal to an arbitrary reference voltage; and
   means for increasing or decreasing said ratio as appropriate to modify said loop gain in response to an actual output in order to achieve an expected output,
   whereby said loop gain of said comparison sequencer is calibrated to a desired value in order to obtain accurate analog to digital conversion.

2. The apparatus as recited in claim 1 which further comprises:
   means for receiving an analog signal;
   means for sampling said analog signal; and
   means for holding said sample.

3. The apparatus as recited in claim 2 which further comprises:
   means for converting said sample into digital information, bit by bit, one bit per cycle of said algorithm, by sequentially comparing and acting upon said sample to a reference voltage, where said loop gain of said comparison sequence is controlled by a ratio of input capacitors to feedback capacitors.

4. The apparatus as recited in claim 3 which further comprises:

means for adjusting a value for said input capacitors to effect said calibration to said loop gain.

5. The apparatus as recited in claim 4 which further comprises:
   means for storing said adjusting to said input capacitors.

6. The apparatus as recited in claim 5 which further comprises:
   means for initiating calibration cycles.

7. An algorithmic analog to digital converter including a differential amplifier having an inverting and a non-inverting input, an inverting and a non-inverting output and an input capacitance and a feedback capacitance where a loop gain that is proportional to a ratio of said input capacitance to said output capacitance of an algorithmic comparison sequencer is calibrated and an input charge injection offset is reduced by an apparatus comprising:
   means for causing a calibration sequence for which a sample voltage is equal to an arbitrary reference voltage;
   means for increasing or decreasing said ratio as appropriate to modify said loop gain in response to an actual output in order to achieve an expected output; and
   means for electrically connecting the inverting input to the non-inverting input through an MOS transistor switch, whereby said loop gain of said comparison sequence is calibrated to a desired value and a charge injected into said amplifier is reduced in order to obtain accurate analog to digital conversions.

8. The apparatus as recited in claim 7 which further comprises:
   means for receiving an analog signal;
   means to sample said analog signal; and
   means to hold said sample.

9. An apparatus as recited in claim 8 which further comprises:
   means for converting said sample into digital information, bit by bit, one bit per cycle of said algorithm, by sequentially comparing and acting upon said sample to a reference voltage, where said loop gain of said comparison sequence is controlled by a ratio of input capacitors to feedback capacitors.

10. The apparatus as recited in claim 9 which further comprises:
    means for adjusting a value of said input capacitors to calibrate said loop gain.

11. The apparatus as recited in claim 10 which further comprises:
    means for storing said adjustment to said input capacitors.

12. The apparatus as recited in claim 11 which further comprises:
    means for initiating calibration cycles.

13. A self-calibrating algorithmic analog to digital converter with reduced input charge injection offset comprising:
    means for receiving an analog signal;
    means for sampling said analog signal;
    means for holding a sample;
    algorithmic means for converting said sample into digital information, bit by bit, one bit per cycle of said algorithm, by sequentially comparing and acting upon said sample to a reference voltage through a gain-of-two amplifier stage with inverting and non-inverting inputs, where a loop gain of said comparison sequence is controlled by a ratio of input capacitance to feedback capacitance;
    means for causing said sample to be equal to said reference voltage;
    means for increasing or decreasing as appropriate a value of said input capacitance to calibrate said loop gain said input capacitance having a plurality of switched capacitors;
    means for storing said adjustment to said input capacitance;
    means for initiating calibration cycles;
    means for electrically connecting said inverting input to said non-inverting inputs through a low impedance path,
    whereby said loop gain of said comparison sequence is calibrated to a predetermined desired value in order to obtain accurate analog to digital conversions.

* * * * *

UNITED STATES PATENT AND TRADEMARK OFFICE
CERTIFICATE OF CORRECTION

PATENT NO. : 5,027,116
DATED : June 25, 1991
INVENTOR(S): Michael Armstrong and Paul Gray It is certified that error appears in the above - identified patent and that said Letters Patent is hereby corrected as shown below:

In Col. 2, line 17, delete ", will," and replace with --will--.

In Col. 3, line 7, delete ",".

In Col. 3, line 42, delete "switches" and replace with --switch--.

In Col. 3, line 43, after "either" delete ",".

In Col. 4, line 18, delete "$n \geq 1$" and replace with --$n \neq 1$--.

In Col. 4, line 28, after "FIGS." insert --,--.

In Col. 4, line 35, after "FIG." delete "3ma" and replace with --3a--.

In Col. 7, line 3, delete "interconnection" and replace with --interconnections--.

In Col. 7, line 4, after "bit" delete --,--.

In Col. 7, lines 23 and 24, delete "If the signal received on inputs 132 and 142 is positive, i.e., if" and replace with --If--.

UNITED STATES PATENT AND TRADEMARK OFFICE
CERTIFICATE OF CORRECTION

PATENT NO. : 5,027,116
DATED : June 25, 1991
INVENTOR(S) : Michael Armstrong and Paul Gray It is certified that error appears in the above - identified patent and that said Letters Patent is hereby corrected as shown below:

In Col. 7, line 25, delete "14" and replace with --146--.

In Col. 7, line 46, after "and" insert --146--.

In Col. 7, line 54, after "134" delete ",".

In the Claims:

In Col. 11, claim 5, line 5, please delete "adjusting" and replace with --adjustment--.

In Col. 12, claim 13, line 32, after "gain" insert --,--.

Signed and Sealed this

Fifth Day of January, 1993

*Attest:*

DOUGLAS B. COMER

*Attesting Officer*     *Acting Commissioner of Patents and Trademarks*